United States Patent
Chung et al.

(10) Patent No.: US 8,207,040 B2
(45) Date of Patent: Jun. 26, 2012

(54) METHODS OF MANUFACTURING SEMICONDUCTOR DEVICES INCLUDING FORMING (111) FACETS IN SILICON CAPPING LAYERS ON SOURCE/DRAIN REGIONS

(75) Inventors: Hoi-Sung Chung, Hwaseong-si (KR); Dong-Suk Shin, Yongin-si (KR); Dong-Hyuk Kim, Seongnam-si (KR); Jung-Shik Heo, Seoul (KR); Myung-Sun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/021,029

(22) Filed: Feb. 4, 2011

(65) Prior Publication Data

US 2011/0201166 A1  Aug. 18, 2011

(30) Foreign Application Priority Data

Feb. 12, 2010  (KR) ........................ 10-2010-0013123

(51) Int. Cl.
*H01L 21/8238* (2006.01)
*H01L 21/336* (2006.01)
*H01L 21/36* (2006.01)
*H01L 21/425* (2006.01)

(52) U.S. Cl. ........ 438/285; 438/199; 438/231; 438/305; 438/488; 438/514; 438/938; 257/E29.193; 257/E21.632

(58) Field of Classification Search .................. 438/199, 438/231, 285, 305, 488, 514, 938; 257/E29.193, 257/E21.632
See application file for complete search history.

(56) References Cited

U.S. PATENT DOCUMENTS

| | | | |
|---|---|---|---|
| 2002/0008261 A1* | 1/2002 | Nishiyama | 257/288 |
| 2006/0125040 A1* | 6/2006 | Levin et al. | 257/471 |
| 2006/0131656 A1* | 6/2006 | Shin et al. | 257/369 |
| 2008/0142839 A1* | 6/2008 | Fukutome et al. | 257/190 |
| 2009/0166625 A1* | 7/2009 | Ting et al. | 257/51 |

FOREIGN PATENT DOCUMENTS

| | | |
|---|---|---|
| KR | 10-237279 B1 | 10/1999 |
| KR | 10 2006-0076150 A | 7/2006 |
| KR | 10 2007-0100787 A | 10/2007 |

* cited by examiner

*Primary Examiner* — Kevin Parendo
(74) *Attorney, Agent, or Firm* — Lee & Morse, P.C.

(57) ABSTRACT

A method of manufacturing a semiconductor device includes forming a gate electrode on a semiconductor substrate and a sidewall spacer on the gate electrode. Then, a portion of the semiconductor substrate at both sides of the sidewall spacer is partially etched to form a trench. A SiGe mixed crystal layer is formed in the trench. A silicon layer is formed on the SiGe mixed crystal layer. A portion of the silicon layer is partially etched using an etching solution having different etching rates in accordance with a crystal direction of a face of the silicon layer to form a capping layer including a silicon facet having an (111) inclined face.

17 Claims, 10 Drawing Sheets

METHODS OF MANUFACTURING SEMICONDUCTOR DEVICES INCLUDING FORMING (111) FACETS IN SILICON CAPPING LAYERS ON SOURCE/DRAIN REGIONS

BACKGROUND

1. Field

Example embodiments relate to methods of manufacturing semiconductor devices. More particularly, example embodiments relate to methods of manufacturing semiconductor devices showing a high performance and including ultra small size transistors.

2. Description of the Related Art

Miniaturization of patterns may be an essential factor for forming highly integrated semiconductor devices. Nowadays, ultra small size semiconductor devices may have a high operating speed and having a gate length of, e.g., about 40 nm or less, have been manufactured.

For the ultra small size semiconductor devices including transistors having the high operating speed, an area of a channel region provided under a gate electrode may be comparatively small when compared to that of the conventional semiconductor devices. Mobility of electrons or holes traveling through the channel region may be largely affected by, e.g., an applied stress to the channel region. Accordingly, various studies on optimizing a strength of the stress applied to the channel region and on improving the operating speed of the semiconductor devices have been widely conducted.

A hole mobility may be smaller than an electron mobility for semiconductor devices including a silicon substrate as a channel. Therefore, an increase of an operating speed of a p-channel MOS transistor using the holes as carriers may be important when designing an integrated semiconductor circuit device.

For the p-channel MOS transistor, the hole mobility may increase by applying a uniaxial compressive stress to the channel region. To explain an applying means of the compressive stress to the channel region, an exemplary schematic constitution of a cross-sectional view a p-MOS transistor is illustrated in FIG. 1.

Referring to FIG. 1, on a silicon substrate 1, a gate insulating layer 2 and a gate electrode 3 corresponding to a channel region may be formed. In the substrate 1 at both side portions of the gate electrode 2, p-type diffusion regions 1*a* and 1*b* for defining the channel region may be formed. On side walls of the gate electrode 3, sidewall spacers 3A and 3B may be formed.

The diffusion regions 1*a* and 1*b* may respectively function as an extension region of a source and a drain of the MOS transistor. The flowing of the holes moving through the channel region under the gate electrode 3 may be controlled by a gate voltage applied to the gate electrode 3.

Referring to FIG. 1 again, SiGe mixed crystal layers 1A and 1B may be formed in the silicon substrate 1 at both exterior sides of the sidewall spacers 3A and 3B. In the SiGe mixed crystal layers 1A and 1B, p-type source and drain regions, respectively contacting the diffusion regions 1*a* and 1*b* may be formed.

For the MOS transistor having the constitution illustrated in FIG. 1, since the SiGe mixed crystal layers 1A and 1B may have a larger lattice constant than that of the silicon substrate 1, a compressive stress may be formed as designated by an arrow 'a' in the SiGe mixed crystal layers 1A and 1B. Thus, a bending stress approximately vertical to a surface portion of the silicon substrate 1 and designated by an arrow 'b' may be generated in the SiGe mixed crystal layers 1A and 1B.

Since the SiGe mixed crystal layers 1A and 1B may be formed through an epitaxial growing process from the silicon substrate 1, a bending stress may be generated in a vertical direction as designated by an arrow 'c' in the channel region of the silicon substrate in accordance with the stress of the SiGe mixed crystal layers 1A and 1B as designated by the arrow 'b'. In addition, a uniaxial compressive stress may be generated as designated by an arrow 'd' similar to the above-described bending stress in the channel region.

For the MOS transistor in FIG. 1, a symmetric property of a silicon crystal constituting the channel region may be locally deformed through the application of the uniaxial compressive stress to the channel region. In accordance with a change of the symmetric property, a valence band of heavy holes and a valence band of light holes may be untied and the hole mobility in the channel region may increase and so an operating speed of the transistor may increase. The increase of the hole mobility due to the local separation of the stress in the channel region and resulting improvement of the operating speed of the transistor may be particularly shown in ultra small size semiconductor devices having a gate length of about 50 nm or less.

In Korean Patent No. 10-0657395 B1 published on Dec. 7, 2006, a detailed description on background of the above-described technique is disclosed on page 5, lines 1-22 referring to FIG. 1.

FIG. 2 is a cross-sectional view of a p-MOS transistor having another structure.

In FIG. 2, a MOS transistor including a capping layer 40 having a silicon facet (Si facet) to prevent consumption or deterioration of a SiGe mixed crystal layer 35 is illustrated.

Referring to FIG. 2, in order to form the capping layer 40 including the silicon facet on the SiGe mixed crystal layer 35, a large amount of hydrogen chloride (HCl) may be introduced while performing an epitaxial growing process of silicon to form the capping layer 40 including an inclined sidewall. However, when the large amount of hydrogen chloride is supplied, a pit may be probably generated at the capping layer 40 including the silicon facet. In addition, a growing rate of silicon while performing the epitaxial growing process may be largely decreased due to the introduction of hydrogen chloride.

In this case, a processing temperature may be increased to increase the growing rate of the layer sufficiently. When the processing temperature is increased, defects may be generated due to a thermal budget.

SUMMARY

Example embodiments provide methods of manufacturing semiconductor devices including simple processes and restraining a generation of pitting defects, and thus manufactured semiconductor devices may include a MOS transistor having an improved performance.

According to example embodiments, there is provided a method of manufacturing a semiconductor device. In the method, a gate electrode is formed on a semiconductor substrate. A sidewall spacer is formed on the gate electrode. A portion of the semiconductor substrate at both sides of the sidewall spacer is partially etched to form a trench. A SiGe mixed crystal layer is formed in the trench. A silicon layer is formed on the SiGe mixed crystal layer. A portion of the silicon layer is partially etched using an etching solution having different etching rates in accordance with a crystal direction of a face of the silicon layer to form a capping layer including a silicon facet (Si facet) having an (111) inclined face.

In example embodiments, a process of doping impurities into the capping layer and the substrate at both sides of the capping layer to form source/drain impurity doped regions may be further performed.

In example embodiments, the silicon layer may be formed so as to have a larger thickness than the capping layer.

In example embodiments, the silicon layer may be formed using an epitaxial growing process.

In example embodiments, the epitaxial growing process may be performed to form the silicon layer having a sidewall having a vertical inclination.

In example embodiments, the etching solution for etching the silicon layer may have a slower etching rate with respect to the (111) face than that with respect to other faces.

In example embodiments, the etching solution for etching the silicon layer may include an —OH functional group.

In example embodiments, the etching solution may include at least one of ammonium hydroxide (NH$_4$OH) and tetramethylammonium hydroxide (TMAH).

In example embodiments, the etching process of the silicon layer along with the (111) face of the silicon layer may be stopped when the silicon layer contacting the substrate starts to be etched.

In example embodiments, a process of forming a metal silicide layer on the capping layer may be further performed.

In example embodiments, an angle between an upper surface of the substrate and the trench may be in a range of about 40° to about 90°.

In example embodiments, the SiGe mixed crystal layer may be formed to fill up an inner portion of the trench.

In example embodiments, the sidewall spacer may be formed by using silicon oxide.

In example embodiments, the sidewall spacer may be removed to expose a sidewall portion of the silicon layer after forming the silicon layer.

According to example embodiments, there is provided a method of manufacturing a transistor. In the method, an n-type gate electrode and a p-type gate electrode are formed on a semiconductor substrate, respectively. A first sidewall spacer and a second sidewall spacer are formed on the n-type gate electrode and the p-type gate electrode, respectively. A portion of the semiconductor substrate at both sides of the second sidewall spacer formed in the p-type gate electrode is partially etched to form a trench. A SiGe mixed crystal layer is formed in the trench. A silicon layer is formed on the SiGe mixed crystal layer. A portion of the silicon layer is partially etched using an etching solution having different etching rates in accordance with a crystal direction of a face of the silicon layer, to form a capping layer including a silicon face (Si facet) having an (111) inclined face. A p-type impurity doped region is formed in the substrate at both sides of the p-type gate electrode. An n-type impurity doped region is formed in the substrate at both sides of the n-type gate electrode.

In example embodiments, a process of forming a passivation layer covering surfaces of the n-type gate electrode, the p-type gate electrode and the substrate may be further performed.

In example embodiments, the passivation layer may be formed using silicon nitride.

In example embodiments, the silicon layer may be formed so as to have a larger thickness than the capping layer.

In example embodiments, the etching solution for etching the silicon layer may have a slower etching rate with respect to the (111) face than that with respect to other faces.

In example embodiments, the etching solution for etching the silicon layer may include an —OH functional group.

According to example embodiments, a semiconductor device including a capping layer including a silicon facet having an (111) face on a SiGe mixed crystal layer may be manufactured. Because of the SiGe mixed crystal layer and the capping layer, a hole mobility of the semiconductor device may be increased. The capping layer may be formed without performing a heat treatment at a high temperature and may not receive a thermal budget. In addition, a pitting defect may be rarely generated in the capping layer. Accordingly, a semiconductor device showing improved electric properties may be obtained.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Figure 1:
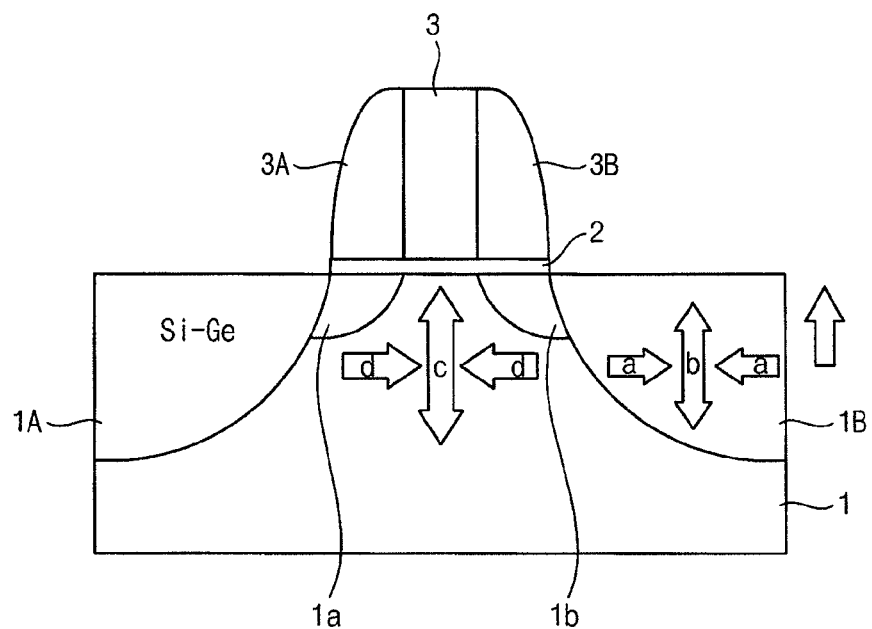
FIG. 1 illustrates a cross-sectional view of an exemplary p-MOS transistor.
Figure 2:
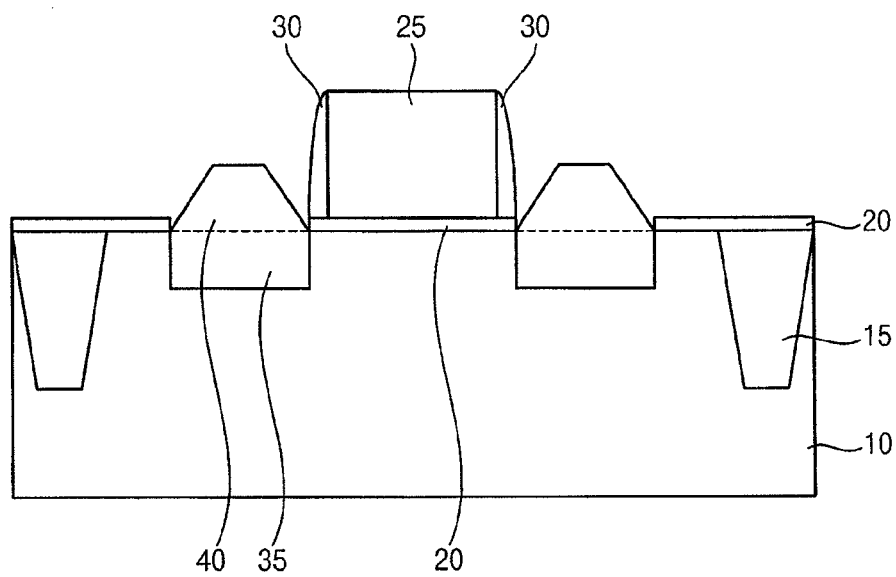
FIG. 2 illustrates a cross-sectional view of an exemplary p-MOS transistor including a SiGe mixed crystal layer.

Korean Patent Application No. 10-2010-0013123, filed on Feb. 12, 2010, in the Korean Intellectual Property Office, and entitled: "Methods of Manufacturing Semiconductor Devices," is incorporated by reference herein in its entirety.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the teams first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Hereinafter, example embodiments on methods of manufacturing a semiconductor device will be explained in detail.

FIGS. 3 to 8 are cross-sectional views for explaining a method of forming a MOS transistor in accordance with an example embodiment.

Figure 3:
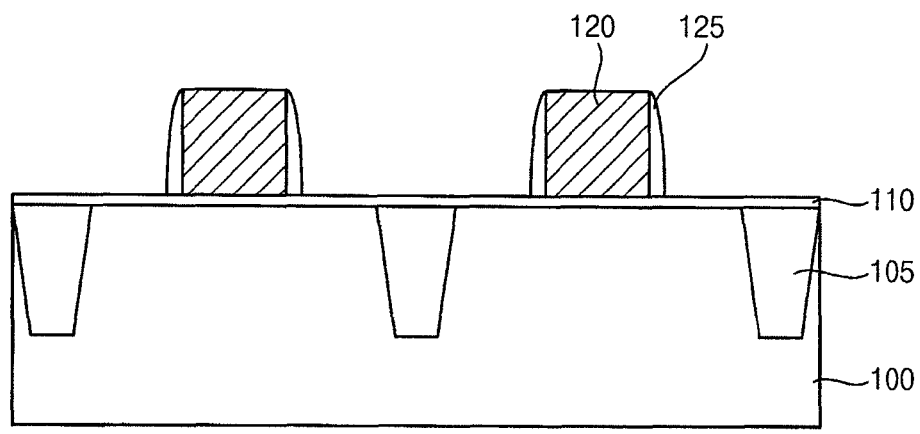
FIGS. 3 to 8 illustrate cross-sectional views for explaining a method of forming a MOS transistor, in accordance with example embodiments.

Referring to FIG. 3, a device isolation layer 105 may be formed in a semiconductor substrate 100 to sectionalize the semiconductor substrate 100 into an active region and a non-active region.

The device isolation layer 105 may be formed by a shallow trench isolation (STI) process. Particularly, a portion of the substrate 100 may be etched to form a trench for device isolation. On a surface of the trench for device isolation, a thin thermal oxidation layer may be formed. Then, an inner portion of the trench for device isolation may be filled up with silicon oxide by means of a chemical vapor deposition (CVD) process or a high density plasma (HDP) CVD process, and a planarization process may be performed.

On the semiconductor substrate 100, a gate dielectric layer 110 may be formed. The gate dielectric layer 110 may include at least one of a silicon oxide ($SiO_2$) layer, a hafnium oxide ($HfO_2$) layer, a tantalum oxide ($Ta_2O_3$) layer, and an ONO (oxide/nitride/oxide) layer. On the gate dielectric layer 110, a conductive layer for forming a gate electrode 120 may be formed. The conductive layer may be formed by means of a CVD process or an atomic layer deposition (ALD) process. The conductive layer may be patterned to form the gate electrode 120.

Examples of forming materials that may be used for the gate electrode may include, e.g., titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), and tungsten silicon nitride (WSiN).

On a sidewall portion of the gate electrode 120, an oxide layer spacer 125 may be formed.

Figure 4:
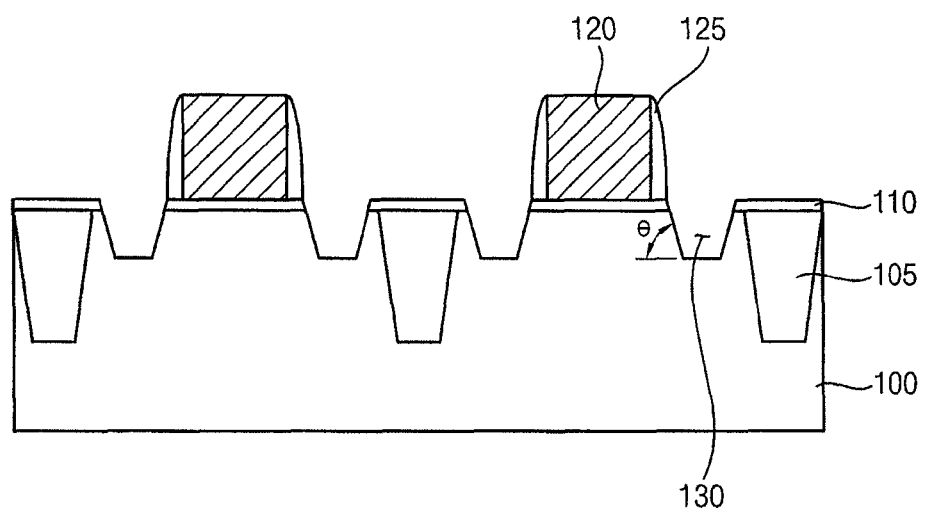

Referring to FIG. 4, the semiconductor substrate 100 may be etched using the oxide layer spacer 125 on the sidewall of the gate electrode 120 as an etching mask to form a trench 130. A SiGe mixed crystal layer may be formed within the trench 130 in a following process. Accordingly, the trench 130 may be formed to have the same shape of the SiGe mixed crystal layer to be formed.

The trench 130 may be formed to make an angle θ of about 40° to about 90° obtained between a plane parallel to an upper surface of the semiconductor substrate 100, and an inclined surface of the trench 130, e.g., as shown in FIG. 4. The plane parallel to the upper surface of the semiconductor substrate 100 may extend next to the inclined surface of the trench 130 at a side adjacent to a bottom surface of the trench 130, e.g., as illustrated in FIG. 4. The angle may be about 40° to about 80°. For example, when θ is 50°, a constitution of a bending system may be effectively accomplished. The trench may be formed to make angles having the same one value. Alternatively, the trench may be formed to make a plurality of angles between the upper surface of the semiconductor substrate 100 and the inclined surface of the trench 130. The SiGe mixed crystal layer may fill up the inner portion of the trench to constitute the bending system so that a compressive stress may be applied to a channel region.

As described above, the compressive stress may be applied to the channel region and a symmetric property of a silicon crystal constituting the channel region may be locally deformed. In this case, without intending to be bound by this theory, a valence band of heavy holes and a valence band of light holes may be untied and a hole mobility through the channel region may be increased and an operating speed of a transistor may be improved.

In accordance with example embodiments, the trenches 130 may be formed in every region where an n-type transistor and a p-type transistor may be formed. The trenches 130 may be formed in only one kind of region among the regions including the n-type and the p-type transistors.

Figure 5:
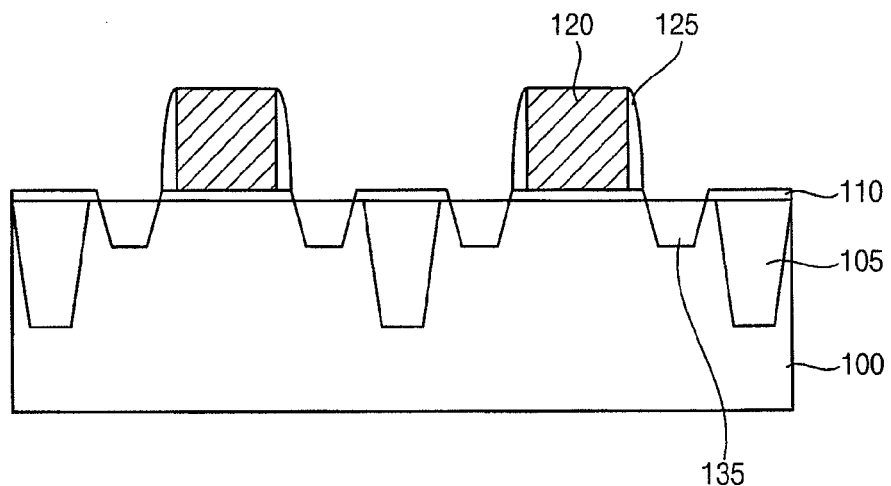

Referring to FIG. 5, an epitaxial growing process using a SiGe growing nuclear may be performed to form a SiGe mixed crystal layer 135 in the trench 130. When the SiGe mixed crystal layer 135 is formed, a uniaxial compressive stress due to a difference of lattice constants of the SiGe mixed crystal layer 135 with the semiconductor substrate 100 may be applied to a channel region under a gate electrode in a device region. Accordingly, a large compressive stress may be applied to the channel region under the gate electrode and an electron mobility and a hole mobility may be increased. Particularly, the hole mobility may be largely increased.

While forming the SiGe mixed crystal layer 135, a SiGe source gas and a hydrogen chloride (HCl) gas may be introduced at the same time to control a growing rate of the SiGe mixed crystal layer 135. The SiGe mixed crystal layer 135 may be formed to completely fill up the inner portion of the trench 130.

Since the SiGe mixed crystal layer 135 may become a source region and/or a drain region, p-type impurities or n-type impurities may be added in situ while performing the epitaxial growing process. Alternatively, the p-type impurities or the n-type impurities may be doped into the SiGe mixed crystal layer 135 after forming the SiGe mixed crystal layer 135. Thus formed SiGe mixed crystal layer 135 may become source/drain impurity regions.

Figure 6:
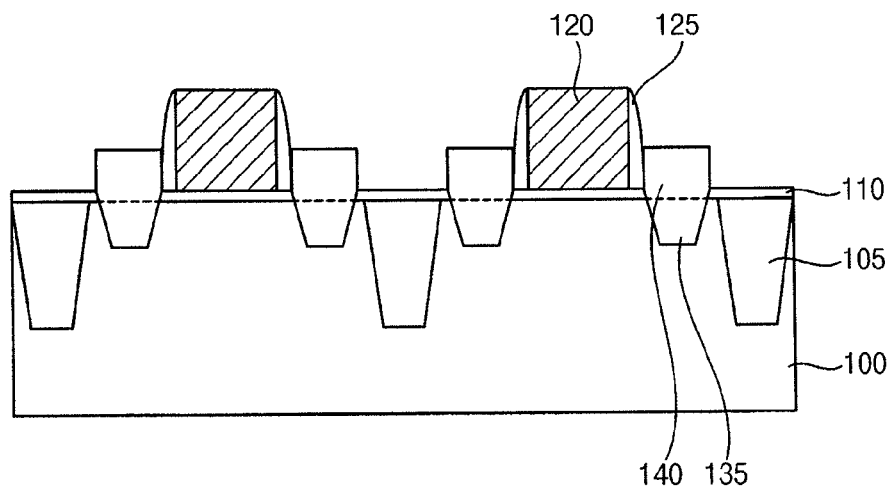

Referring to FIG. 6, after forming the SiGe mixed crystal layer 135, an epitaxial growing process using a Si growing nuclear may be performed to form an epitaxial silicon layer 140 on the SiGe mixed crystal layer 135.

The epitaxial silicon layer 140 may be formed to have an inclined sidewall. That is, the epitaxial silicon layer 140 may be formed to have an inclined sidewall of the epitaxial silicon layer 140 with a constant angle with respect to an upper surface of the substrate 100 and so a growing process to form a silicon facet may not be required. Accordingly, separate process conditions for forming the silicon facet may not be required.

Accordingly, during forming the epitaxial silicon layer 140, hydrogen chloride for controlling the growing rate of the epitaxial growing process in order to form the inclined sidewall may not be introduced. When hydrogen chloride is used during the epitaxial growing process, the growing rate of the epitaxial silicon layer 140 may be largely decreased. In accordance with example embodiments, without intending to be bound by this theory, hydrogen chloride may not be used and so the epitaxial silicon layer 140 may grow even more rapidly. Since the epitaxial silicon layer 140 may grow sufficiently rapidly, a process performed at a high temperature to increase the growing rate of the epitaxial silicon layer 140 may be omitted. The epitaxial silicon layer 140 may be easily grown at a low temperature.

Therefore, a pitting phenomenon generally generated in the epitaxial silicon layer 140 by using an excessive amount of hydrogen chloride may be suppressed during a formation of the epitaxial silicon layer 140. In addition, the epitaxial silicon layer 140 may be grown at a low temperature and so thermal problems occurring when performing the epitaxial growing process at a high temperature may be solved in accordance with example embodiments.

The epitaxial silicon layer 140 may be processed to a silicon capping layer including a silicon facet through a subsequently performed wet etching process. Accordingly, the epitaxial silicon layer 140 may be formed to a thickness larger than that of the target silicon capping layer to be formed. Particularly, the epitaxial silicon layer 140 may be formed to have a thickness of about 500 angstroms to about 1,000 angstroms.

Figure 7:
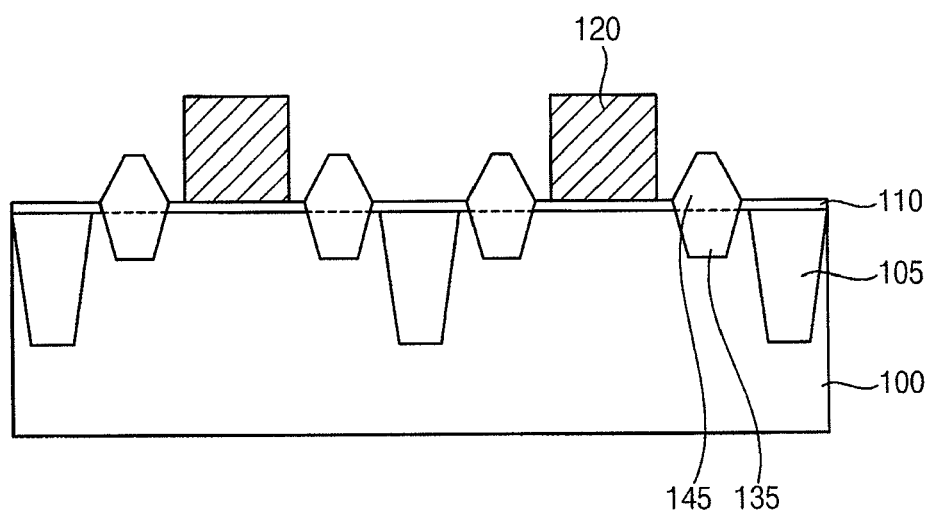

Referring to FIG. 7, the oxide layer spacer 125 may be removed to expose the sidewall of the epitaxial silicon layer 140. The epitaxial silicon layer 140 may be wet etched using an etching solution having different etching rates in accordance with a crystal direction of a face of the epitaxial silicon layer 140. Particularly, the wet etching may be performed using an etching solution having a relatively low etching rate for an (111) face when compared to other faces to be etched. A silicon capping layer 145 having a silicon facet of the (111) face may be formed. The (111) face of the silicon capping layer 145 may be an (111) inclined face, e.g., according to Miller indices.

The wet etching solution may be an etching solution including an —OH functional group. Examples of the solution that may be used for the wet etching may include ammonium hydroxide (NH$_4$OH), tetramethylammonium hydroxide (TMAH), etc. When the epitaxial silicon layer 140 is etched using one of the wet etching solutions, the (111) face of the epitaxial silicon layer 140 may be etched slowly, while the (100) face may be etched rapidly. The sidewall of the epitaxial silicon layer 140 may be etched to have an inclined face and the silicon capping layer 145 including the silicon facet having the (111) face may be formed as illustrated in FIG. 7.

The etching process with respect to the (111) face of the epitaxial silicon layer 140 may be stopped when the epitaxial silicon layer 140 contacting the semiconductor substrate 100 is etched.

The silicon capping layer 145 having the (111) face may be formed without generating problems concerning pitting or thermal problems in accordance with the above described processes. In addition, an abrasion of the underlying SiGe mixed crystal layer 135 may be suppressed and so normal source/drain regions may be formed. Without intending to be bound by this theory, since the silicon capping layer 145 has the (111) face, impurities or halo-impurities for forming a lightly doped drain (LDD) structure may be doped into the silicon capping layer 145 while maintaining an accurate doping angle. Further, when a metal silicide layer is formed on the source/drain regions to decrease a resistance of the source/drain regions, a forming process of the metal silicide layer may be easily carried out.

Figure 8:
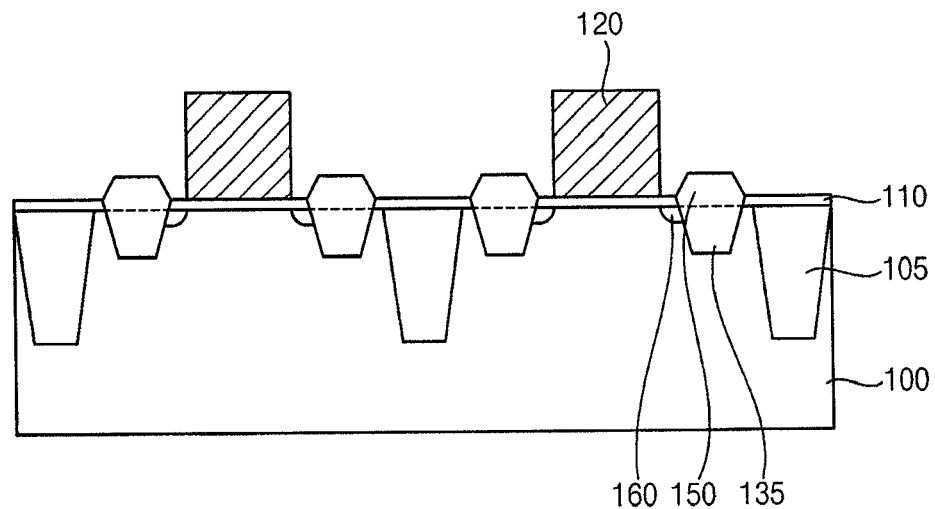

Referring to FIG. 8, a capping layer pattern 150 may be formed by partially etching a portion of an upper surface of the silicon capping layer 145. Impurities may be doped into the capping layer pattern 150 using an inclined angle of the silicon facet of the capping layer pattern 150 to form lightly doped source/drain impurity regions 160 and highly doped source/drain impurity regions. The lightly doped source/drain impurity regions 160 may be formed in the semiconductor substrate 100 adjacent to a side surface of the SiGe mixed crystal layer 135. The highly doped source/drain impurity regions may be formed in the SiGe mixed crystal layer 135 and the capping layer pattern 150. Through the above-described processes, an LDD structure of source/drain regions including the lightly doped source/drain impurity regions 160 and the highly doped source/drain impurity regions may be obtained.

Alternatively, halo-impurities may be doped into the substrate 100, the capping layer pattern 150 and the SiGe mixed crystal layer 135 using the inclined angle of the silicon facet in accordance with a demand of devices.

As described in the above manufacturing methods, without intending to be bound by this theory, the capping layer pattern 150 having the silicon facet may be formed by a process without introducing an excessive amount of hydrogen chloride or by a process without applying a high temperature. Accordingly, pitting defects due to hydrogen chloride and a thermal damage may be minimized.

FIGS. 9 to 18 are cross-sectional views for explaining a method of manufacturing a semiconductor device including a MOS transistor having an improved performance in accordance with example embodiments.

Figure 9:
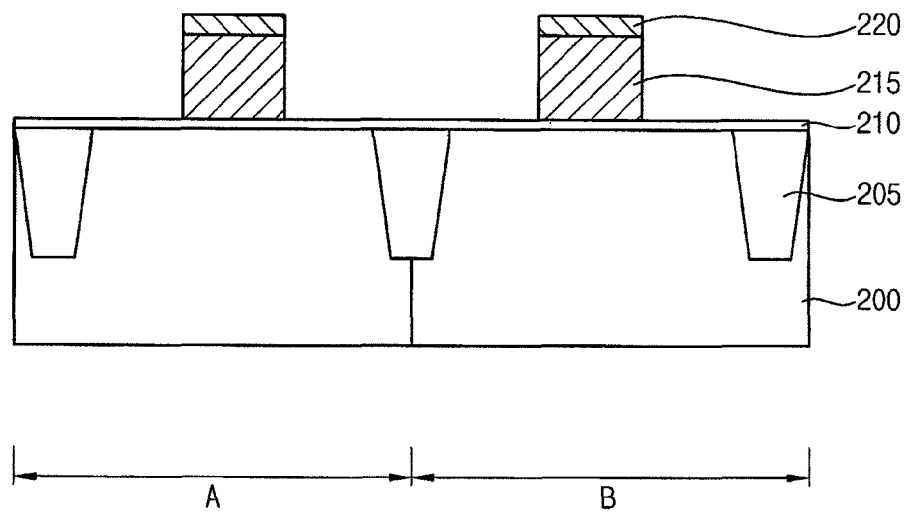
FIGS. 9 to 18 illustrate cross-sectional views for explaining a method of manufacturing a semiconductor device including a MOS transistor, in accordance with example embodiments.

Referring to FIG. 9, a device isolation layer 205 may be formed on a semiconductor substrate 200 to sectionalize the substrate 200 into an active region and a non-active region. The semiconductor substrate 200 may be sectionalized into a region A in which an n-MOS transistor may be formed and a region B in which a p-MOS transistor may be formed.

In a MOS transistor, a hole mobility may be improved when a SiGe mixed crystal layer is formed at both sides of a channel layer. Accordingly, a performance of the n-MOS transistor may be even more improved than that of the pMOS transistor. In accordance with some embodiments, a semiconductor device including a capping layer including a SiGe mixed crystal layer and a silicon facet may be formed only in the p-MOS region to efficiently accomplish the spirit of the invention.

The device isolation layer 205 may be formed using a shallow trench isolation (STI) process. Particularly, a portion of the substrate 200 may be etched to form a trench for isolating devices and then, a thin thermal oxidation layer may be formed on a surface portion of the trench for isolating devices. Then, an inner portion of the trench for isolating devices may be filled up with silicon oxide using a CVD process or an HDP process and the substrate may be planarized.

A gate dielectric layer 210 may be formed on the planarized semiconductor substrate 200. The gate dielectric layer 210 may include at least one of a silicon oxide ($SiO_2$) layer, a hafnium oxide ($HfO_2$) layer, a tantalum oxide ($Ta_2O_5$) layer and an ONO (oxide/nitride/oxide) layer. On the gate dielectric layer 210, a conductive layer for forming a gate electrode 215 may be formed. The conductive layer may be formed using a CVD process or an atomic layer deposition (ALD) process.

Examples of conductive materials that may be used for the gate electrode 215 may include titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), and tungsten silicon nitride (WSiN). A hard mask 220 may be formed on the gate electrode 215 under the necessity. Then, the conductive layer may be patterned using the hard mask as an etching mask to form a gate electrode structure including the gate electrode 215 and the hard mask 220. That is, a gate electrode structure for an n-MOS transistor may be formed in an n-MOS region and a gate electrode structure for a p-MOS transistor may be formed in a p-MOS region.

Figure 10:
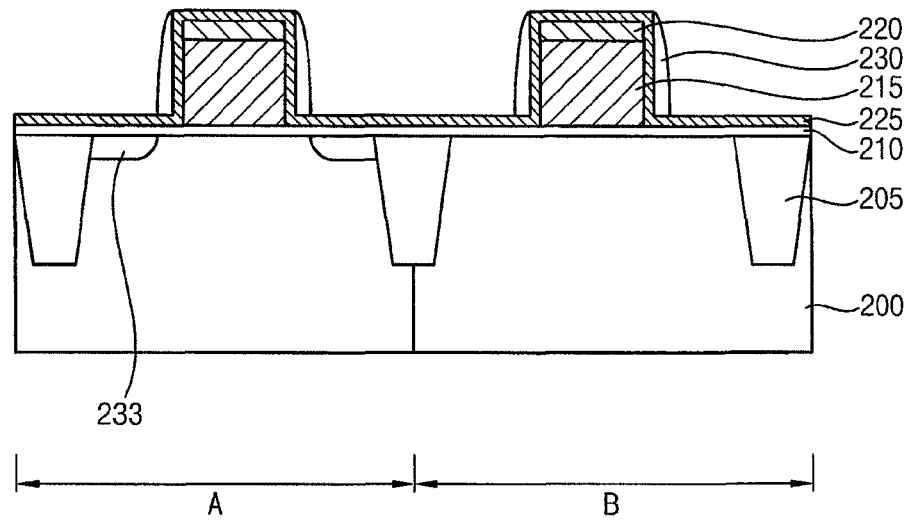

Referring to FIG. 10, a passivation layer 225 covering the semiconductor substrate 200 and the gate electrode structure including 215 and 220 may be formed. The passivation layer 225 may be formed using silicon nitride. On the passivation layer 225, a silicon oxide layer may be deposited and then, the silicon oxide layer may be anisotropically etched to form a sidewall spacer 230. After forming the sidewall spacer 230, source/drain impurity regions 233 may be formed only in the n-MOS region.

The n-MOS source/drain impurity regions may be formed after forming a SiGe mixed crystal layer in a following process even though not illustrated in FIG. 10. That is, the sequence of processes for forming the n-MOS source/drain impurity regions may be changed. For example, when the n-MOS source/drain impurity regions 233 are affected by a temperature applied during a formation of the SiGe mixed crystal layer, the nMOS source/drain impurity regions 233 may be formed after forming the SiGe mixed crystal layer.

Figure 11:
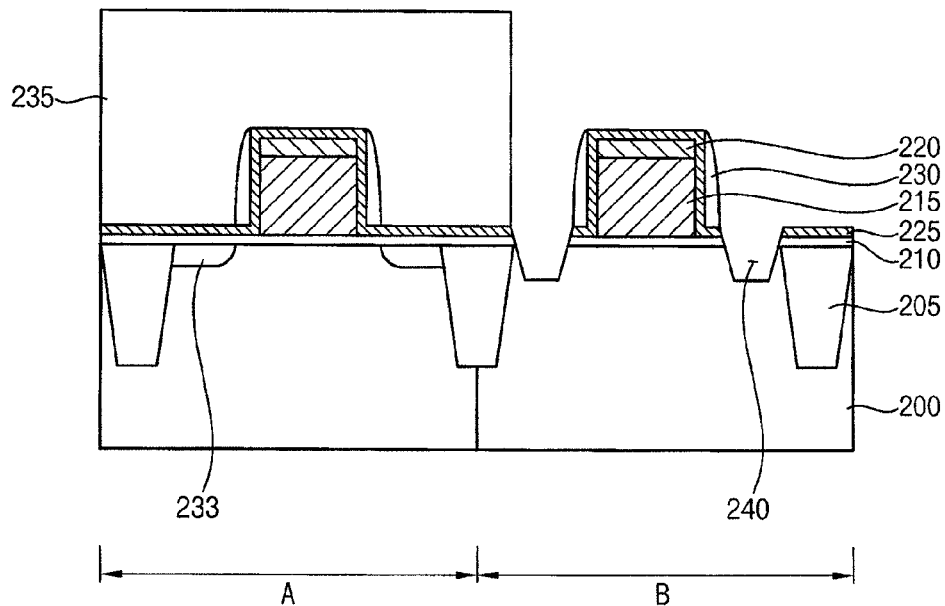

Referring to FIG. 11, a photoresist layer 235 for exposing a p-MOS region while covering an n-MOS region may be formed.

A trench 240 may be formed by etching the substrate 200 using the sidewall spacer 230 of the gate electrode 215, as an etching mask, formed on the semiconductor substrate 200 in the p-MOS region, i.e., the in B region. The trench 240 may be formed to have an angle θ between a plane parallel to an upper surface of the substrate 200 and the inclined surface of the trench 240 from about 40° to about 90°. The plane parallel to the upper surface of the substrate 200 may extend next to the inclined surface of the trench 240 at a side adjacent to a bottom surface of the trench 240, e.g., as illustrated in FIG. 4. Moreover, the angle may be from about 40° to about 80°. For example, when the angle θ is 56°, a bending system may be efficiently formed. The trenches may be formed to have only one inclining angle between the upper surface of the semiconductor substrate 200 and the inclined surface of the trench 240. Alternatively, the trenches may be formed to have a plurality of the inclining angles between the upper surface of the semiconductor substrate 200 and the inclined surface of the trench 240, even though not illustrated in FIG. 11. In this case, an inner portion of the trench 240 may be filled up with the SiGe mixed crystal layer to form a bending system so that a compressive stress may be applied to a channel region.

Figure 12:
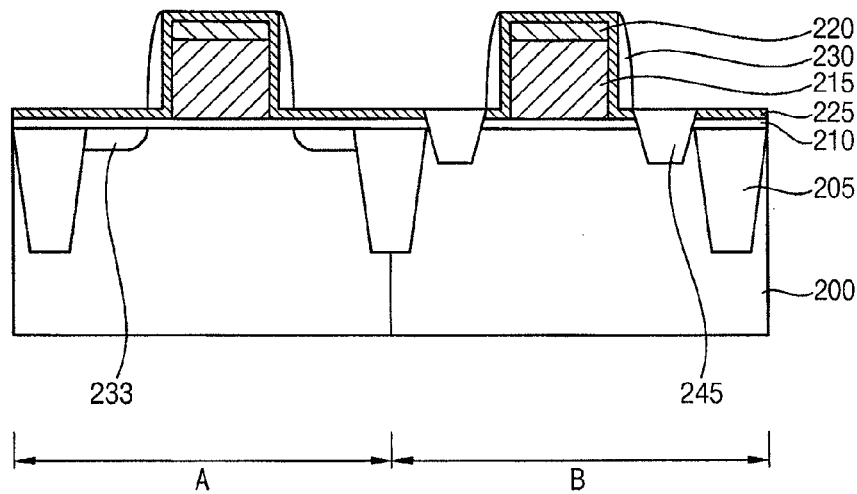

Referring to FIG. 12, an epitaxial growing process using a SiGe growing nuclear may be performed to form a SiGe mixed crystal layer 245 within the trench 240 formed in the semiconductor substrate 200 in the p-MOS region. Upon forming the SiGe mixed crystal layer 245, a uniaxial compressive stress generated due to a difference of a lattice constant of the SiGe mixed crystal layer 245 from that of the semiconductor substrate 200 may be applied to a channel region provided under the gate electrode 215 in the p-MOS region. In this case, a large compressive stress may be applied to the channel region under the gate electrode 215 to increase a hole mobility. In accordance with some embodiments, the SiGe mixed crystal layer 245 may be formed in the p-MOS region and the hole mobility of the formed pMOS transistor may be increased to remarkably improve device properties.

Without intending to be bound by this theory, the compressive stress generated by the SiGe mixed crystal layer 245 may locally change a symmetric property of a silicon crystal constituting the channel region. Accordingly, a valence band of heavy holes and a valence band of light holes may be untied and a hole mobility through the channel region may be increased to improve an operating speed of a transistor.

A growing rate of the SiGe mixed crystal layer 245 may be controlled by introducing a SiGe source gas along with a hydrogen chloride gas. In addition, the growing rate may be controlled by changing a process temperature. Therefore, the growing rate may be determined by controlling the two process conditions appropriately. The SiGe mixed crystal layer 245 may be formed so as to fill up the inner portion of the trench 240 completely.

The forming process of the SiGe mixed crystal layer 245 may be performed at a temperature from about 400° C. to about 550° C. An epitaxial growing process may be performed using a Si gaseous material of a silane ($SiH_4$) gas and a Ge gaseous material of a germane ($GeH_4$) gas along with hydrogen chloride as a catalytic gas.

When an (100) face or an (111) face of Si is exposed at a bottom portion or a sidewall portion of the trench while performing the epitaxial growing process for forming the SiGe mixed crystal layer 245, a SiGe mixed crystal layer 245 including almost no crystal defects may be obtained. Accordingly, when the trench 240 includes an inclined sidewall portion, the SiGe mixed crystal layer 245 having a desired shape may be easily formed.

The SiGe mixed crystal layer 245 filling up the inner portion of the trench may function to apply a uniaxial compressive stress due to a difference of a crystal constant of the SiGe mixed crystal layer 245 with the semiconductor substrate 200, to a channel region provided under the gate insulating layer 210 in the p-MOS region. Accordingly, the trench may be desirably formed to have a structure so that the stress may be concentrated onto the channel region.

The SiGe mixed crystal layer 245 may become source/drain regions in a following process. Accordingly, p-type impurities may be added in situ while performing the epitaxial growing process to obtain the source/drain impurity doped regions. Alternatively, the SiGe mixed crystal layer 245 may be formed first and then, the p-type impurities may be doped into the SiGe mixed crystal layer 245.

Figure 13:
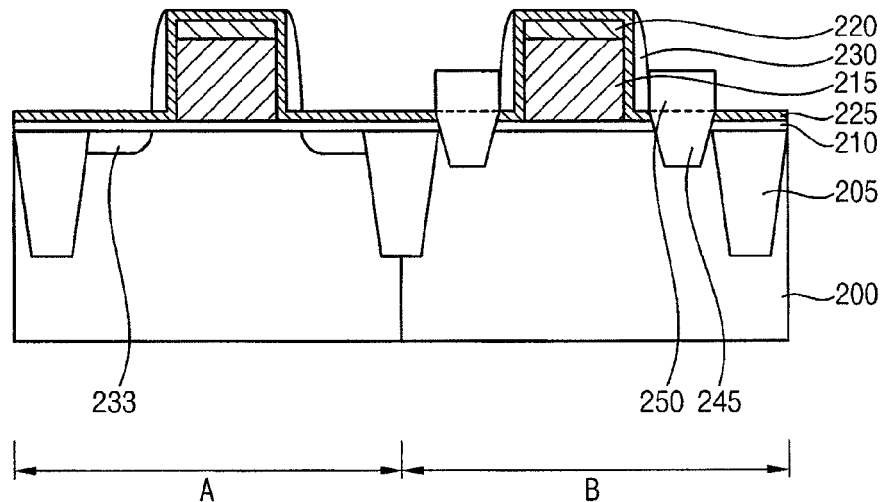

Referring to FIG. 13, an epitaxial silicon layer 250 may be formed by performing an epitaxial process using a Si growing nuclear.

The epitaxial silicon layer 250 may be formed to have a vertical sidewall. That is, the epitaxial silicon layer 250 may not be grown to form a silicon facet so as to form a certain angle between the upper surface of the substrate and the sidewall of the epitaxial silicon layer 150. Accordingly, separate process conditions may not be required to form the silicon facet.

Therefore, during a formation of the epitaxial silicon layer 250, an introducing process of hydrogen chloride for controlling an epitaxial growing rate to form an inclined sidewall may not be performed. Without intending to be bound by this theory, since the introducing process of hydrogen chloride that may largely decrease the epitaxial growing rate may be omitted, the epitaxial silicon layer 250 may be formed at an even more rapid growing rate. In addition, since the epitaxial silicon layer 250 may be grown at a sufficiently rapid rate, a process at a high temperature to increase the growing rate may be omitted. Accordingly, the epitaxial silicon layer 250 may be easily formed at a low temperature.

When hydrogen chloride is introduced during a formation of the epitaxial silicon layer 250, a pitting defect may be generated in the epitaxial silicon layer 250. However, without intending to be bound by this theory, hydrogen chloride may not be introduced while forming the epitaxial silicon layer 250 in accordance with example embodiments, the pitting defect may be suppressed. Further, since the epitaxial silicon layer 250 may be grown at a low temperature, a problem possibly generated while performing the growing process at a high temperature may be avoided.

The epitaxial silicon layer 250 may be processed to form a silicon capping layer having a silicon facet through a following wet etching process. The epitaxial silicon layer 250 may be formed to have a thickness larger than the target silicon capping layer. The epitaxial silicon layer 250 may be grown to a thickness in a range of about 500 angstroms to about 1,000 angstroms.

Crystal growing of the epitaxial silicon layer 250 may start from an upper surface of the SiGe mixed crystal layer 245.

Figure 14:
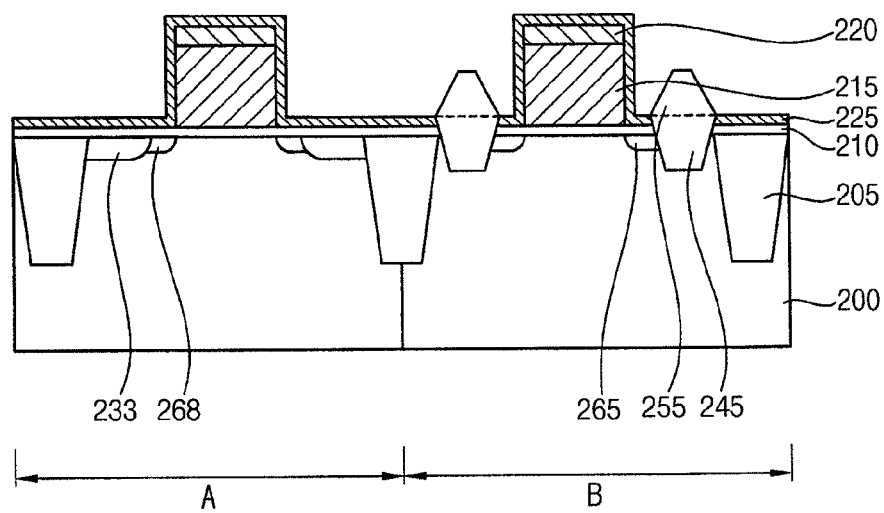

Referring to FIG. 14, the sidewall spacer 230 formed on a sidewall of the gate electrode 215 may be removed. Then, the sidewall portion of the epitaxial silicon layer 250 may be exposed out.

Then, the epitaxial silicon layer 250 may be wet etched to form a silicon capping layer 255 including a silicon facet having an (111) face. The wet etching may be performed using an etching solution having a different etching rate in accordance with a crystal direction of the face of the epitaxial silicon layer 250. For the (111) face of the epitaxial silicon layer 250, an etching solution having a lower etching rate than that with respect to other face may be used.

Particularly, the wet etching solution may include an —OH functional group. The wet etching solution may include $NH_4OH$, TMAH, etc. When one of the above-described wet etching solutions is used, the sidewall portion of the epitaxial silicon layer 250 may be etched to have an inclined face. Accordingly, the silicon capping layer 255 including the silicon facet having the (111) face may be formed, e.g., as illustrated in FIG. 14.

During performing the etching process for forming the silicon capping layer 255, the etching process may be stopped when the epitaxial silicon layer 250 contacting the semiconductor substrate 200 starts to be etched along with the (111) face of the epitaxial silicon layer 250.

Without intending to be bound by this theory, the silicon capping layer 255 having the (111) face may be formed without generating any pitting defects or a thermal budget in accordance with the above-described process. In addition, an abrasion of underlying SiGe mixed crystal layer 245 may be suppressed and so normal source/drain regions of a p-MOS transistor may be obtained. Since the silicon capping layer 255 may include the (111) face, an impurity doping process at an accurate angle may be performed in a following impurity doping process or a halo-impurity doping process for forming an LDD structure.

An n-MOS region may be covered using a photoresist layer (not shown). P-type impurities may be doped into the pMOS region using the inclining angle of the silicon facet to form lightly doped source/drain impurity regions 265 and highly doped source/drain impurity regions. The lightly doped source/drain impurity regions 265 may be formed in the semiconductor substrate 200 in the p-MOS region adjacent to a sidewall portion of the SiGe mixed crystal layer 245. The highly doped source/drain impurity regions may be formed in the SiGe mixed crystal layer 245 and the silicon capping layer 255. Source/drain regions of an LDD structure including the lightly doped source/drain regions and the highly doped source/drain regions may be obtained.

Then, the p-MOS region may be covered using a photoresist layer (not shown) and n-type impurities may be doped into an n-MOS region to form n-type source/drain impurity regions 268 and 233 of an LDD structure.

Halo-impurities may be doped using an inclining angle of the silicon facet included in a capping layer pattern for some devices.

A p-MOS transistor including the SiGe mixed crystal layer 245 and having a high hole mobility may be formed in the p-MOS region. The p-MOS transistor may include source/drain regions of an LDD structure. An n-MOS transistor excluding the SiGe mixed crystal layer may be formed in the n-MOS region.

Figure 15:
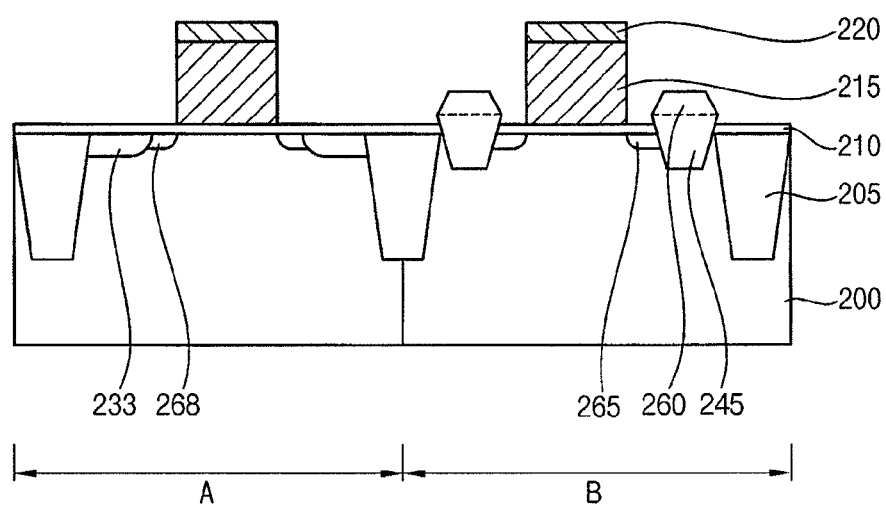

Referring to FIG. 15, after completing the impurity doping process, the passivation layer 225 may be removed using a wet etching process. Without intending to be bound by this theory, since the passivation layer 225 having a relatively high dielectricity may be removed from the sidewall of the gate electrode 215, a parasitic capacitance generated between the gate electrode 215 and the impurity region 265 may be decreased. Accordingly, a device having improved electric properties may be formed.

After removing the passivation layer 225, an upper surface of the silicon capping layer may be etched to form a capping layer pattern 260. Upon forming the capping layer pattern 260, a source/drain metal silicide layer may be easily formed in a following process. Without intending to be bound by this theory, since the capping layer pattern 260 may include few crystal defects or impurities therein but may include a large amount of silicon component, a binding force with the metal silicide layer may be good. Accordingly, a metal silicide layer having a good binding force with the capping layer pattern 260 and a low resistivity may be obtained.

Figure 16:
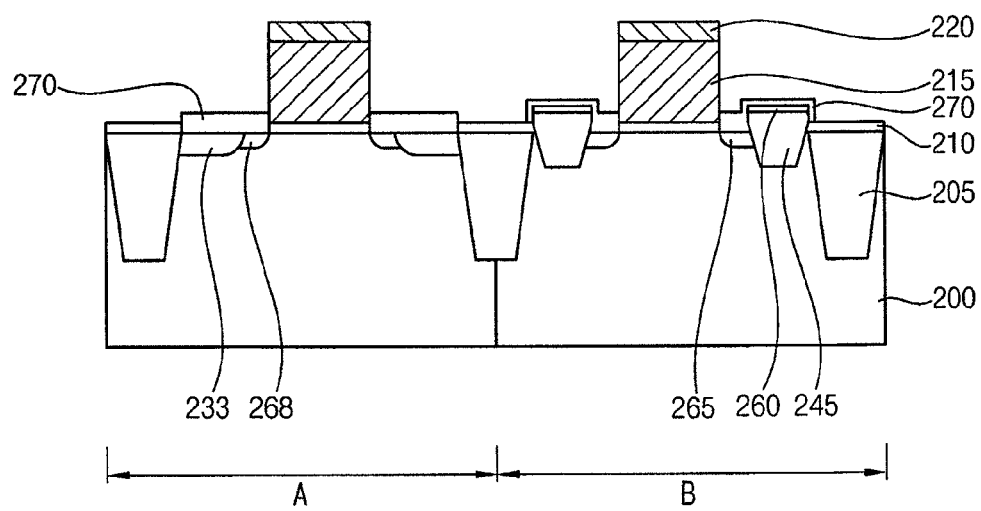

Referring to FIG. 16, a metal silicide layer 270 may be formed on the source/drain regions using a metal silicide forming process. In the p-MOS region, the metal silicide layer 270 may be formed on an upper surface of the capping layer pattern 260 including the silicon facet. In the n-MOS region, the metal silicide layer 270 may be formed on the substrate 200 including the impurity doped region. The metal silicide layer 270 may be formed by using one of nickel silicide, cobalt silicide, etc.

Figure 17:
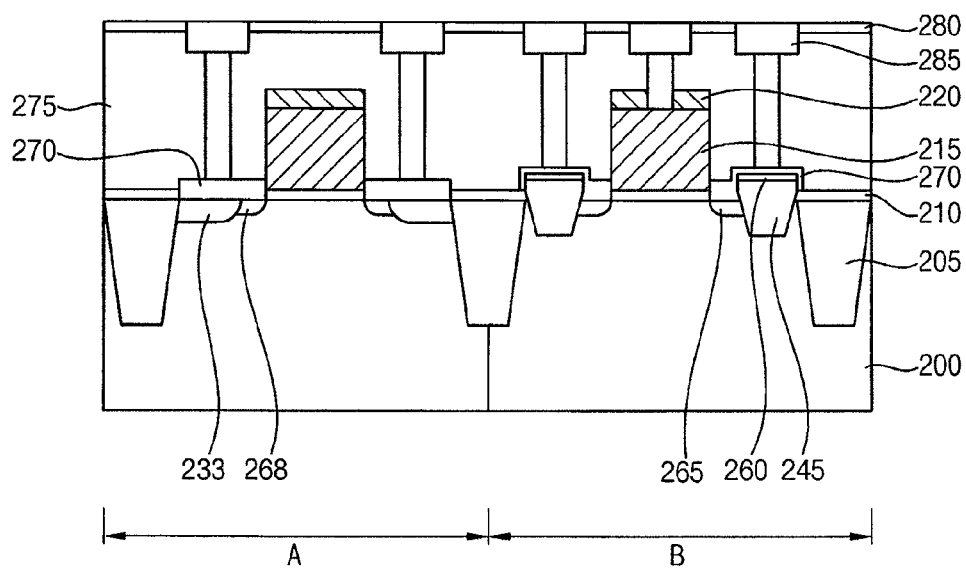

Referring to FIG. 17, a first insulating interlayer 275 may be formed to cover the semiconductor substrate 200 and the gate electrode 215. On the first insulating interlayer 275, an etch stopping layer 280 may be formed. Then, a first metal wiring 285 may be formed on the first insulating interlayer 275 by using a contact forming process or a damascene process. The first metal wiring 285 may be formed using a material having a low resistivity including copper, tungsten, etc.

Figure 18:
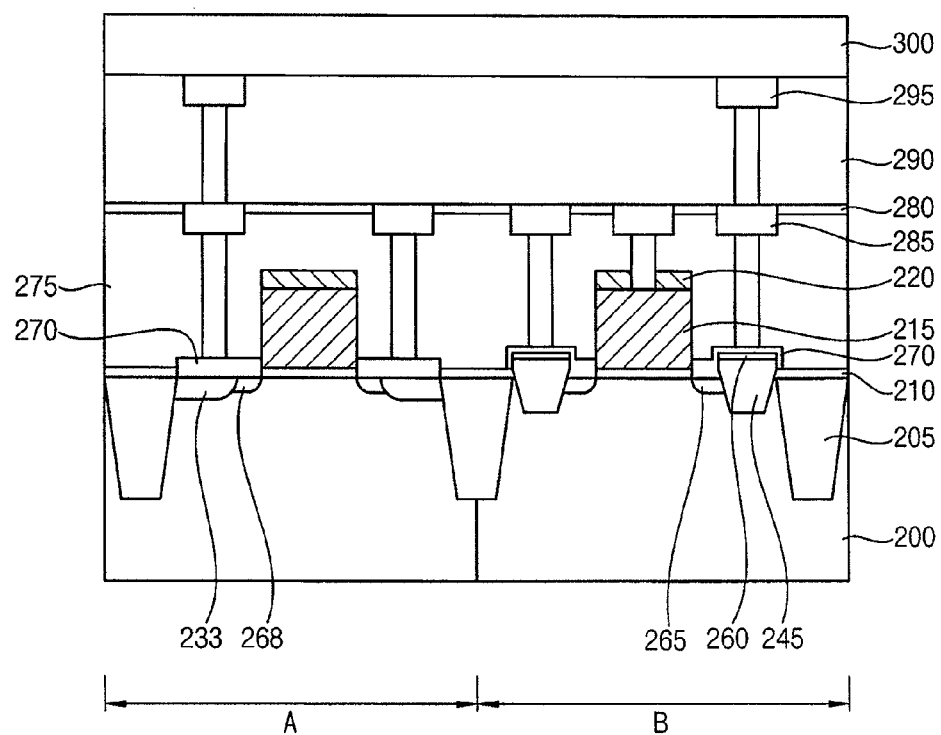

Referring to FIG. 18, a second insulating interlayer 290 may be formed on the etch stopping layer 280. Then, a second metal wiring 295 may be formed on the second insulating interlayer 290 by using a contact forming process or a damascene process. The second metal wiring may be formed using copper, tungsten, etc. A passivation layer 300 may be formed on the second metal wiring 295.

As described above, a capping layer pattern 260 including a silicon facet may be formed using a process performed without introducing a large amount of hydrogen chloride or by a process performed without applying a high temperature. Accordingly, without intending to be bound by this theory, a pitting defect due to hydrogen chloride or a thermal damage due to the high temperature may be minimized.

Upon forming the capping layer pattern 260, an abrasion of a SiGe mixed crystal layer 245 may be prevented and a metal silicide layer having a good quality may be formed. In addition, a semiconductor device having improved electric characteristics may be manufactured.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
  forming a gate electrode on a semiconductor substrate;
  forming a sidewall spacer on the gate electrode;
  partially etching a portion of the semiconductor substrate at a side of the sidewall spacer to form a trench;
  forming a SiGe mixed crystal layer in the trench;
  forming a silicon layer on the SiGe mixed crystal layer; and
  partially etching a portion of the silicon layer with an etching solution, the etching solution for etching the silicon layer having a slower etching rate with respect to a (111) face of the silicon layer than that with respect to other faces of the silicon layer to form a capping layer including a silicon facet having an (111) inclined face.

2. The method as claimed in claim 1, further comprising doping impurities into the capping layer and the substrate at a side of the capping layer to form a source or drain impurity doped region.

3. The method as claimed in claim 1, wherein the silicon layer is formed through an epitaxial growing process.

4. The method as claimed in claim 3, wherein the epitaxial growing process is performed to form the silicon layer having a sidewall having a vertical inclination.

5. The method as claimed in claim 1, wherein the etching solution for etching the silicon layer includes an —OH functional group.

6. The method as claimed in claim 5, wherein the etching solution includes at least one of ammonium hydroxide ($NH_4OH$) and tetramethylammonium hydroxide (TMAH).

7. The method as claimed in claim 1, further comprising forming a metal silicide layer on the capping layer.

8. The method as claimed in claim 1, wherein an angle between a plane parallel to an upper surface of the substrate and the trench is in a range of about 40° to about 90°.

9. The method as claimed in claim 1, wherein the SiGe mixed crystal layer is formed to fill up an inner portion of the trench.

10. The method as claimed in claim 1, wherein the sidewall spacer is formed by using a silicon oxide.

11. The method as claimed in claim 1, wherein the sidewall spacer is removed to expose a sidewall portion of the silicon layer after forming the silicon layer.

12. The method as claimed in claim 1, wherein the trench is one of a plurality of trenches, and partially etching the portion of the semiconductor substrate includes forming the trenches at both sides of the gate electrode.

13. A method of manufacturing a semiconductor device, the method comprising:
  forming an n-type gate electrode and a p-type gate electrode on a semiconductor substrate;
  forming a first sidewall spacer and a second sidewall spacer on the n-type gate electrode and the p-type gate electrode, respectively;
  partially etching a portion of the semiconductor substrate at a side of the second sidewall spacer formed on the p-type gate electrode to form a trench;
  forming a SiGe mixed crystal layer in the trench;
  forming a silicon layer on the SiGe mixed crystal layer;
  partially etching a portion of the silicon layer using an etching solution, the etching solution for etching the silicon layer having a slower etching rate with respect to a (111) face of the silicon layer than that with respect to other faces of a face of the silicon layer, to form a capping layer including a silicon facet having an (111) inclined face;
  forming a p-type impurity doped region in the substrate at both sides of the p-type gate electrode; and
  forming an n-type impurity doped region in the substrate at both sides of the n-type gate electrode.

14. The method as claimed in claim 13, further comprising forming a passivation layer covering surfaces of the n-type gate electrode, the p-type gate electrode, and the substrate.

15. The method as claimed in claim 14, wherein the passivation layer is formed using a silicon nitride.

16. The method as claimed in claim 13, wherein the etching solution for etching the silicon layer includes an —OH functional group.

17. The method as claimed in claim 13, wherein the trench is one of a plurality of trenches, and partially etching the portion of the semiconductor substrate includes forming the trenches at the both sides of the p-type gate electrode.

* * * * *